(12) United States Patent
Chen et al.

(10) Patent No.: US 6,573,595 B1
(45) Date of Patent: Jun. 3, 2003

(54) BALL GRID ARRAY SEMICONDUCTOR PACKAGE WITH RESIN COATED METAL CORE

(75) Inventors: James Chen, Taipei (TW); Rong-Huei Wang, Hsinchu (TW)

(73) Assignee: Scientek Corp., Hsinchu Schien (TW)

( * ) Notice: Subject to any disclaimer, the term of this patent is extended or adjusted under 35 U.S.C. 154(b) by 0 days.

(21) Appl. No.: 10/128,272

(22) Filed: Apr. 24, 2002

(51) Int. Cl.⁷ ................................................ H01L 23/04
(52) U.S. Cl. ........................................ 257/698; 257/784
(58) Field of Search .................................. 257/783, 780, 257/781, 786, 782, 778, 698, 720, 784

(56) References Cited

U.S. PATENT DOCUMENTS

| | | | |
|---|---|---|---|
| 5,198,693 A | * | 3/1993 | Imken et al. |
| 5,640,047 A | * | 6/1997 | Nakashima |
| 6,137,185 A | * | 10/2000 | Ishino et al. |
| 6,304,564 B1 | * | 3/2001 | Miyata et al. |
| 6,232,661 B1 | * | 5/2001 | Amagai et al. |
| 6,242,815 B1 | * | 6/2001 | Hsu et al. |
| 6,291,895 B1 | * | 9/2001 | Tanigushi et al. |

* cited by examiner

*Primary Examiner*—Sheila V. Clark
(74) *Attorney, Agent, or Firm*—Rosenberg, Klein & Lee

(57) ABSTRACT

The present invention provides a ball grid array semiconductor package having a resin coated metal core substrate. The semiconductor device comprises a resin coated metal core substrate, solder balls, chip adhesive material, at least one semiconductor chip, bonding wires, and encapsulant. The metal core is made from a conductive material, for example, a metal lead frame and coated with a resin to form a resin covered metal core substrate structure. The resin coating covers both sides of the metal core except for selected areas of the metal core, such as where it is desired to attach the bonding wires or the solder balls. A liquid encapsulant is formed to cover desired areas of the resin coated substrate, bonding wires, adhesive material, and the semiconductor chip. Since the outer surface of the substrate is substantially of resin material, the adhesion between the substrate and the encapsulant is much stronger than if a standard conventional substrate was used. Due to the resin coated metal core, the semiconductor device has improved thermal performance, higher reliability, and lower cost.

10 Claims, 1 Drawing Sheet

BALL GRID ARRAY SEMICONDUCTOR PACKAGE WITH RESIN COATED METAL CORE

BACKGROUND OF THE INVENTION

1. Field of the Invention

The present invention relates to a semiconductor package. More specifically, the present invention discloses a ball grid array semiconductor package having a resin coated substrate with a metal core.

2. Description of the Prior Art

As electronic devices have become more compact and with more features, integrated circuits utilized in such electronic devices have been required to be reduced in size while transistor count inside the device has increased.

As a result, semiconductor packaging has continually advanced. Currently, a popular packaging method is the ball grid array (BGA). This type of semiconductor device uses balls for conductive leads in place of traditional wire leads.

Refer to FIG. 1, which is a sectional view showing the construction of a conventional BGA semiconductor package.

The conventional BGA device includes a semiconductor chip 102 having an integrated circuit and a plurality of signal input/output pads 104. The chip is bonded to the central portion of the upper surface of a printed circuit board (PCB) 110 by a bonding layer 106. The PCB 110 comprises a resin substrate 111 having a circuit pattern on each of the upper and lower surfaces. The circuit patterns on the upper and lower surfaces of the substrate 111 are formed by a plurality of conductive traces 112, 113, respectively. The conductive traces 112 and 113 are coated over with a high molecular resin solder mask 130.

A chip pad 116 is formed on the central portion of the upper surface of the resin substrate 111 to receive and mount the chip 102. The chip 102 is bonded to the pad 116 by a bonding layer 106. A plurality of first conductive traces 112 are formed on the upper surface of the substrate 111 at predetermined intervals, thereby forming an upper circuit pattern. The upper circuit pattern is coated with a solder mask 130. A plurality of second conductive traces 113 are formed on the lower surface of the substrate 111 and are each electrically connected to an associated one of the first conductive traces 112 through conductive via holes 114. A circular solder ball land 115, having a double-layered construction comprising a nickel layer 115b and a gold layer 115c, is formed on each of the second conductive traces 113 through an electrolytic plating process. A solder ball 120, is welded to each of the solder ball lands 115 and is used as a signal input/output terminal of the package 100 during signal communication of the package 100 with a main board (not shown). The signal input/output pads 104 of the chip 102 are electrically connected to the first conductive traces 112 using wires 140. The semiconductor chip 102 and the wires 140 are covered using an epoxy molding compound thereby forming an envelope 150 on one side of the package.

The conventional BGA device as described above, has several disadvantages. For example, the multiple masking processes and the number of processing steps and materials make such devices relatively expensive. In addition, the PCB substrate of the conventional device does not easily dissipate heat and is therefore susceptible to problems associated with temperature.

Therefore, there is need for an improved ball grid array semiconductor package with improved thermal performance, higher reliability, and lower cost.

SUMMARY OF THE INVENTION

To achieve these and other advantages and in order to overcome the disadvantages of the conventional method in accordance with the purpose of the invention as embodied and broadly described herein, the present invention provides a ball grid array semiconductor package having a resin coated substrate with a metal core with improved thermal performance, higher reliability, and lower cost.

The BGA semiconductor package with resin coated metal core in accordance to an embodiment of the present invention comprises a metal core, resin substrate covering, solder balls, chip adhesive material, a chip, bonding wires, and encapsulant.

The metal core is, for example, a metal lead frame that is utilized in a conventional lead frame semiconductor package. The metal core is made from a conductive material, for example, copper material. Electrically conductive paths may be formed in the metal frame to create paths for electrical signals to be routed as desired. The metal core is coated with a resin to form a metal core resin covered substrate structure.

The semiconductor chip is adhesively bonded to the resin coated substrate having a metal core by means of an adhesive.

A plurality of bonding wires are bonded or attached between conductive contacts or traces on the active side of the semiconductor chip and the metal core. It should be noted that the resin coating covers both sides of the metal core except for selected areas of the metal core. For example, where it is desired to attach the bonding wires or the solder balls.

The bonding wires are utilized to create selective electrical connections between conductive contacts, pads, or traces on the semiconductor chip and the metal core.

A plurality of solder balls are formed which are electrically connected to the metal core. The solder balls are formed from, for example, Pb, Sn, or other conductive material. The solder balls act as electrodes of the semiconductor device and allow flow of input and output signals between the semiconductor chip and printed circuit boards, frames, or devices on which the semiconductor device is electrically connected.

A liquid encapsulant is formed to cover desired areas of the resin coated substrate, bonding wires, adhesive material, and semiconductor chip. The encapsulant is formed by, for example, printing or molding methods. The encapsulant adhesively fixes and protectively seals the semiconductor chip to the resin coated substrate thereby shielding the semiconductor chip and the bonding wires from the external environment. Additionally, since the substrate is of resin material, the adhesion between the substrate and the encapsulant is much stronger than if a standard metal core substrate was used.

The present invention comprises covering the metal lead frame structure with a resin. The encapsulant of the semiconductor device of the present invention adheres to the resin material. Since the encapsulant and the resin may be of similar materials, the thermal expansion properties are similar and the adhesion between the substrate and the encapsulant is much greater.

Additionally, the heat dissipation properties of the metal core are better than a substrate made solely of resin. Therefore, the thermal performance of the semiconductor device of the present invention is superior.

Furthermore, in an embodiment of the present invention, since the substrate of the present invention comprises a conventional lead frame metal core coated with resin, the production cost of the semiconductor device is lowered. This is due to the fact that the substrate of the present invention utilizing the metal core as conductive paths is less expensive to produce than a resin substrate which requires additional manufacturing processes to provide electrically conductive paths. An advantage of the present invention is that by utilizing inexpensive metal lead frames for the metal core, production costs are lowered.

A common concern with semiconductor devices is the floor life, moisture level, and moisture resistance. Industry standards and requirements are available for moisture/reflow sensitivity for devices. In these specifications, certain standards are given such as moisture resistance, moisture classification level and floor life.

An advantage of the present invention is that by utilizing the resin coated metal core substrate, the semiconductor device of the present invention is capable of consistently meeting the highest level requirements. This not only greatly reduces inventory management and cost of said management, but also allows devices to operate longer without succumbing to failure due to moisture or high temperature.

Another advantage of the present invention, is that due to the electrical characteristics and properties of the resin coated metal core substrate, the semiconductor device exhibits improved operation in high frequency applications.

Therefore, the present invention provides a ball grid array semiconductor package having a resin coated substrate with a metal core with improved thermal performance, higher reliability, and lower cost.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
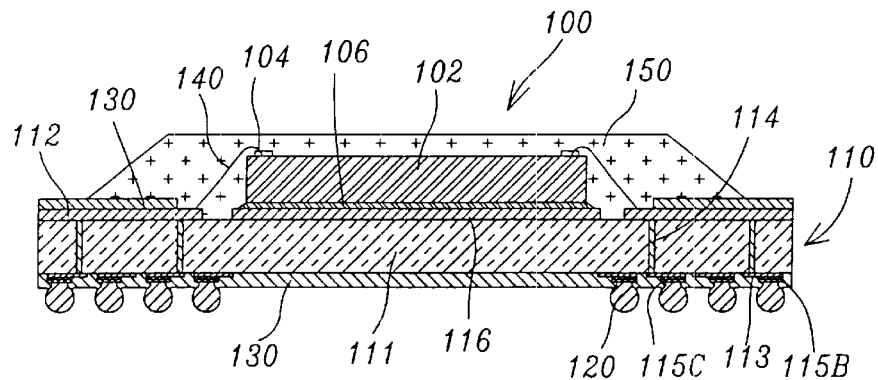
FIG. 1 is a sectional view showing the construction of a conventional BGA semiconductor package.

Reference will now be made in detail to the preferred embodiments of the present invention, examples of which are illustrated in the accompanying drawings. Wherever possible, the same reference numbers are used in the drawings and the description to refer to the same or like parts.

As described above, the conventional BGA device has several disadvantages. For example, the multiple masking processes and the number of processing steps and materials make such devices relatively expensive. In addition, the PCB substrate of the conventional device does not easily dissipate heat and is therefore susceptible to problems associated with temperature.

However, the present invention provides a ball grid array semiconductor package having a resin coated substrate with a metal core with improved thermal performance, higher reliability, and lower cost.

Figure 2:
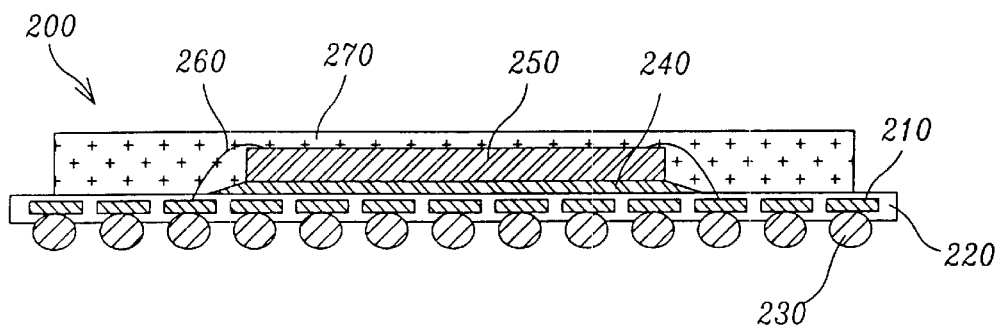
FIG. 2 is a sectional view showing the construction of a BGA semiconductor package with a resin coated metal core substrate in accordance to an embodiment of the present invention.

Refer to FIG. 2, which is a sectional view showing the construction of a BGA semiconductor package with resin coated metal core in accordance to an embodiment of the present invention.

The BGA semiconductor device 200 comprises a metal core 210, resin substrate 220, solder balls 230, chip adhesive material 240, a semiconductor chip 250, bonding wires 260, and encapsulant 270.

The metal core 210 is, for example, a metal lead frame that is utilized in a conventional lead frame semiconductor package. The metal core 210 is made from a conductive material, for example, copper material. Electrically conductive paths can be formed in the metal frame 210 to create paths for electrical signals to be routed as desired. The metal core 210 is coated with a resin 220 to form a metal core resin covered substrate structure.

In such cases where a conventional metal lead frame is utilized for the metal core, the conductive leads that were originally intended to be used in a lead frame package may be trimmed or cut to a desired length or removed entirely so that the metal frame can easily be adapted for use in a BGA package. An advantage of the present invention is that existing inventory or current tooling used to produce said metal lead frames can be used, thus further saving production costs.

The semiconductor chip 250 is bonded, for example, adhesively bonded, to the resin coated substrate 220 having a metal core 210 by means of an adhesive 240. Note that for clarity only one semiconductor chip is given by way of example. In other embodiments of the present invention, multiple semiconductor chips are utilized within the same semiconductor package.

A plurality of conductive means 260 are bonded or attached between conductive contacts or traces on the active side of the semiconductor chip 250 and the metal core 210. The conductive means 260 comprise, for example, bonding wires. It should be noted that the resin coating 220 covers both sides of the metal core 210 except for selected areas of the metal core 210. For example, where it is desired to attach the bonding wires 260 or the solder balls 230.

The conductive means 260 are utilized to create selective electrical connections between conductive contacts, pads, or traces on the semiconductor chip 250 and the metal core 210.

A plurality of solder balls 230 are formed which are electrically connected to the metal core 210. The solder balls 230 are formed from, for example, Pb, Sn, or other conductive material. The solder balls 230 act as electrodes of the semiconductor device 200 and allow flow of input and output signals between the semiconductor chip 250 and the printed circuit boards, frames, or devices to which the semiconductor device 200 is electrically connected.

A liquid encapsulant 270 is formed to cover desired areas of the resin coated substrate 210, conductive means 260, adhesive material 240, and semiconductor chip 250. The encapsulant 270 is formed by, for example, printing or molding methods. The encapsulant 270 adhesively fixes and protectively seals the semiconductor chip 250 to the resin coated substrate 210 thereby shielding the semiconductor chip 250 and the bonding wires 260 from the external environment. Additionally, since the substrate is of resin material, the adhesion between the substrate and the encapsulant is much stronger than if a standard metal core substrate was used.

The different components of the semiconductor device are usually made of materials which have very different material properties. These materials have very different thermal expansion properties. During operation of the device, the electrical power dissipated within the semiconductor chip tends to heat up the device.

The different materials expand by different amounts each time the temperature increases. This causes electrical contacts on the chip to move relative to the electrical contacts on the substrate as the temperature changes. This movement can deform the electrical interconnections between the chip and substrate and places them under mechanical stress. Such stresses are generated each time the device is turned on and off. Repeated exposure to stress may lead to breakage of the electrical interconnections or delamination of the encapsulant, semiconductor chip, bonding wires, or substrate.

Conventional lead frame integrated circuit packaging can suffer from delamination of the encapsulant from the metal lead frame structure due to stress. However, the present invention comprises covering the metal lead frame structure with a resin. The encapsulant of the semiconductor device of the present invention adheres strongly to the resin material. Since the encapsulant and the resin are of similar materials, the thermal expansion properties are similar and the adhesion between the substrate and the encapsulant is much greater.

Additionally, the heat dissipation properties of the metal core are better than a substrate made solely of resin. Therefore, the thermal performance of the semiconductor device of the present invention is superior.

Furthermore, in an embodiment of the present invention, since the substrate of the present invention comprises a conventional lead frame metal core coated with resin, the production cost of the semiconductor device is lowered. This is due to the fact that the substrate of the present invention utilizing the metal core as conductive paths is less expensive to produce than a resin substrate which requires additional manufacturing processes to provide electrically conductive paths. An advantage of the present invention is that by utilizing inexpensive metal lead frames for the metal core, production costs are lowered.

A common concern with semiconductor devices is the floor life, moisture level, and moisture resistance. Industry standards and requirements are available for moisture/reflow sensitivity for devices. In these specifications, certain standards are given such as moisture resistance, moisture classification level and floor life.

Certain levels are given for moisture resistance testing requirements. For example, a device meeting level three requirements is able to withstand one week of exposure to environmental conditions and not fail when heated to a temperature of 220 degrees Celsius. A device meeting level one requirements is able to withstand a limitless time of exposure to environmental conditions and not fail when heated to a temperature of 260 degrees Celsius.

Obviously, it is advantageous for semiconductor devices to achieve the highest level of moisture resistance possible. However, many conventional devices are only capable of reaching the level three requirements.

An advantage of the present invention is that by utilizing the resin coated metal core substrate with its improved heat dissipation characteristics and superior encapsulant to substrate adhesion properties, the semiconductor device of the present invention is capable of consistently meeting the level one requirements. This not only greatly reduces inventory management and cost of said management since devices have a longer floor life, but also allows devices to operate longer without succumbing to failure due to moisture or high temperature conditions.

Another advantage of the present invention, is that due to the electrical characteristics and properties of the resin coated metal core substrate, the semiconductor device exhibits improved operation in high frequency applications.

Therefore, the present invention provides a ball grid array semiconductor package having a resin coated substrate with a metal core with improved thermal performance, higher reliability, and lower cost.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A semiconductor device comprising:
    a metal core having a plurality of metal strip portions;
    a resin coating selectively covering the metal core in substantially enveloping manner;
        whereby the metal core and resin coating form a resin coated metal core substrate;
    at least one semiconductor chip attached to the resin coated metal core substrate;
    a plurality of conductive means electrically coupled to conductive portions of the at least one semiconductor chip and selected areas of the metal core;
    a plurality of conductive balls electrically coupled to the metal core; and
    an encapsulant covering areas of the resin coated metal core substrate, the at least one semiconductor chip, and the plurality of conductive means.

2. A semiconductor device comprising:
    a metal core, whereby the metal core is a metal lead frame;
    a resin coating selectively covering the metal core;
        whereby the metal core and resin coating form a resin coated metal core substrate;
    at least one semiconductor chip attached to the resin coated metal core substrate;
    a plurality of conductive means electrically coupled to conductive portions of the at least one semiconductor chip and selected areas of the metal core;
    a plurality of conductive balls electrically coupled to the metal core; and
    an encapsulant covering areas of the resin coated metal core substrate, the at least one semiconductor chip, and the plurality of conductive means.

3. The semiconductor device of claim 1, whereby the metal core further comprises:
    a plurality of traces forming a circuit pattern to facilitate connection point locations between the plurality of conductive means, the metal core, and the plurality of conductive balls.

4. The semiconductor device of claim 1, whereby the conductive means comprise bonding wires.

5. A semiconductor device comprising:
a metal core having a plurality of metal strip portions;
a resin coating selectively covering the metal core in substantially enveloping manner;
whereby the metal core and resin coating form a resin coated metal core substrate;
a semiconductor chip attached to the resin coated metal core substrate;
a plurality of wires electrically coupled to conductive portions of the semiconductor chip and selected areas of the metal core;
a plurality of solder balls electrically coupled to selected areas of the core;
whereby the plurality of solder balls comprise signal input and output terminals of the ball grid array semiconductor device; and
whereby the resin coating covers the metal core except for areas where the plurality of wires and the plurality of solder balls electrically couple to the metal core; and
an encapsulant covering a top side of the resin coated metal core substrate, the semiconductor chip, and the plurality of wires.

6. A semiconductor device comprising:
a metal core, whereby the metal core is a metal lead frame;
a resin coating selectively covering the metal core;
whereby the metal core and resin coating form a resin coated metal core substrate;
a semiconductor chip attached to the resin coated metal core substrate;
a plurality of wires electrically coupled to conductive portions of the semiconductor chip and selected areas of the metal core;
a plurality of solder balls electrically coupled to selected areas of the core;
whereby the plurality of solder balls comprise signal input and output terminals of the ball grid array semiconductor device; and
whereby the resin coating covers the metal core except for areas where the plurality of wires and the plurality of solder balls electrically couple to the metal core; and
an encapsulant covering a top side of the resin coated metal core substrate, the semiconductor chip, and the plurality of wires.

7. The semiconductor device of claim 5, whereby the metal core further comprises:
a plurality of traces forming a circuit pattern to facilitate connection point locations between the plurality of conductive means, the metal core, and the plurality of conductive balls.

8. The semiconductor device of claim 5, whereby the conductive means comprise bonding wires.

9. A ball grid array semiconductor device comprising:
a metal lead frame;
a resin coating selectively covering the metal lead frame;
whereby the metal core and resin coating form a resin coated metal core substrate;
a semiconductor chip adhesively fixed to the resin coated metal core substrate;
a plurality of bonding wires electrically coupled to conductive portions of the semiconductor chip and selected areas of the metal lead frame not covered by the resin coating;
a plurality of solder balls electrically coupled to selected areas of the metal lead frame not covered by the resin coating;
whereby the plurality of solder balls comprise signal input and output terminals of the ball grid array semiconductor device; and
an encapsulant covering a top side of the resin coated metal core substrate, the semiconductor chip, and the plurality of bonding wires.

10. The semiconductor device of claim 9, whereby the metal lead frame further comprises:
a plurality of traces forming a circuit pattern to facilitate connection point locations between the plurality of conductive wires, the metal lead frame, and the plurality of conductive balls.

\* \* \* \* \*